United States Patent
Kropp (10) Patent No.: US 7,167,492 B2
(45) Date of Patent: Jan. 23, 2007

(54) OPTOELECTRONIC ARRANGEMENT HAVING AT LEAST ONE LASER COMPONENT, AND A METHOD FOR OPERATING A LASER COMPONENT

(75) Inventor: Jörg-Reinhardt Kropp, Berlin (DE)

(73) Assignee: Infineon Technologies AG, Munich (DE)

( * ) Notice: Subject to any disclaimer, the term of this patent is extended or adjusted under 35 U.S.C. 154(b) by 157 days.

(21) Appl. No.: 10/742,534

(22) Filed: Dec. 19, 2003

(65) Prior Publication Data

US 2005/0135442 A1    Jun. 23, 2005

(51) Int. Cl.
*H01S 3/04* (2006.01)

(52) U.S. Cl. ........................................ 372/34
(58) Field of Classification Search ............ 372/34
See application file for complete search history.

(56) References Cited

U.S. PATENT DOCUMENTS

2002/0090011 A1* 7/2002 Pezeshki et al. .............. 372/20
2002/0150131 A1* 10/2002 Tsukiji et al. .................. 372/34
2002/0186729 A1* 12/2002 Nasu et al. ..................... 372/34
2004/0114646 A1* 6/2004 Stewart et al. ................. 372/34

FOREIGN PATENT DOCUMENTS

WO   WO 03/069744 A1   8/2003

* cited by examiner

*Primary Examiner*—Armando Rodriguez
*Assistant Examiner*—Marcia A. Golub
(74) *Attorney, Agent, or Firm*—Eschweiler & Associates, LLC (57) ABSTRACT

An optoelectronic arrangement includes at least one laser component. A heating device for heating the laser component up to a constant temperature is provided in such a way that the laser component is operated at a temperature that is at least equal to the highest temperature to be expected that would be present during operation of the laser component without the heating device. A method for operating a laser component includes heating the laser component to a constant temperature that is at least equal to the highest temperature to be expected that would be present during operation of the laser component without heating. The laser component is then operated at this temperature. The exact monitoring of the emitted wavelength of a laser component is rendered possible in a simple way.

23 Claims, 4 Drawing Sheets

OPTOELECTRONIC ARRANGEMENT HAVING AT LEAST ONE LASER COMPONENT, AND A METHOD FOR OPERATING A LASER COMPONENT

FIELD OF THE INVENTION

The invention relates to an optoelectronic arrangement having at least one laser component, and to a method for operating a laser component. It permits the exact setting and monitoring of the emitted wavelength of a laser component.

BACKGROUND OF THE INVENTION

For the purpose of transmitting as large a quantity of data as possible via an optical waveguide, it is known in optical telecommunications to multiplex the data to be transmitted. One possibility for this purpose is to transmit information independently and simultaneously over one waveguide with the aid of several wavelengths (wavelength division multiplexing—WDM). It is necessary in this case to keep reliably on the transmission side to the various prescribed optical wavelength channels. Thus, there is a need in the transmission modules for an optical arrangement with the aid of which the wavelength of the individual transmission devices can be monitored and, if required, corrected. The aim in this case is for the technical solution provided to be of small overall size, to require little electric power and to be capable of cost-effective production.

WO 03/069744 A1 discloses an optoelectronic module in which a laser chip is arranged on a submount and is cooled by a Peltier cooler of small design. Located on the submount for the purpose of monitoring the wavelength emitted by the laser chip is a temperature sensor via which the operating temperature of the laser can be detected. The signal generated by the temperature sensor is fed to an electronic monitoring and control unit via which the temperature is set after a calibration operation on the laser and is kept stable by suitable control of the current by the Peltier cooler. A temperature is set in this case at which the laser emits the desired optical wavelength, which corresponds to a specific WDM channel.

It is also known for the emitted wavelength to be detected directly in order to monitor and control the wavelength of the light emitted by the laser. Use is made for this purpose of relatively complicated optics having one or more wavelength-dependent filters. By directly detecting the emitted wavelength of the laser component, it is possible to achieve a substantially finer stabilization of the wavelength than by exerting control through using a temperature sensor.

The Peltier cooler used in known optoelectronic arrangements for temperature stabilization are disadvantageously relatively large as a rule. Furthermore, they require a relatively large electric power and are comparatively expensive. Optoelectronic modules with wavelength stabilization are therefore cost intensive both to produce and to operate.

OBJECT OF THE INVENTION

The object of the present invention is to make available an optoelectronic arrangement having at least one laser component, and a method for operating a laser component that permits wavelength stabilization of a laser diode in a simple and cost effective way.

SUMMARY OF THE INVENTION

This object is achieved according to the invention by means of an optoelectronic arrangement that has at least one laser component and a heating device for heating the laser component. The heating device heats the laser component up to a constant temperature that is at least equal to the highest temperature to be expected that would be present during operation of the laser component without the heating device. The laser component is then operated at a constant increased temperature.

The solution according to the invention manages without use of a Peltier cooler and without a cooling of the laser component previously employed for the purpose of wavelength stabilization. It is consequently simple and cost-effective to implement. The solution according to the invention departs from the principle previously used in the prior art of cooling the laser component in order to stabilize the wavelength it emits. Instead of this, the laser component is additionally heated during operation. The laser component is then operated at a temperature that is equal to or somewhat above the highest operating temperature of the laser to be expected that would arise without heating. Such a highest operating temperature to be expected can be determined in a simple way experimentally and constitutes a known parameter of a laser component.

The inventive operation of the laser component at an increased temperature certainly has a disadvantage that the laser is additionally loaded, and aging of the laser occurs more quickly. In applications where no high operating temperatures occur, such an operation at an increased temperature is, however, permissible and rational, since the disadvantages are more than canceled out by the advantages explained.

It may be pointed out that the wavelength of the laser component is shifted in the nature of things by operating the laser component at an increased temperature. However, this occurs to a defined extent. It is therefore possible to design the laser component from the very start in such a way that the emitted wavelength is below a desired wavelength at the usual, cooled temperature. After the laser component has been heated up in a way according to the invention to a desired temperature at or above the highest operating temperature to be expected, the wavelength is then shifted exactly into the region that corresponds to a desired WDM wavelength channel. The wavelength is thus shifted in a defined fashion by the temperature increase.

Overall, the present invention provides a cost effective configuration of an optoelectronic transmission arrangement that permits the output wavelength of a laser component to be stabilized in a simple way.

A heating device for heating the laser component can fundamentally be designed in any desired way. It is preferably formed in a simple way by electrical connections with an increased ohmic electrical resistance that are provided locally at specific locations of the optoelectronic arrangement. In a preferred refinement, the heating device is integrated in the laser component itself. This has the advantage that only the laser component itself is to be heated, and thus the required heating power is minimized.

The heating device is implemented by way of example by a resistance conductor track that is arranged directly on the laser component and is arranged there as near as possible to the active laser channel without impairing the function of the laser component itself. In this arrangement, it is particularly advantageous when the substrate of the laser component itself consists of a material that is a relatively poor conductor of heat, such as InP for example.

In a further preferred refinement, the laser component is mounted on a carrier substrate (submount). It is possible here that for this case the heating device heats the carrier substrate, and the laser component is only heated indirectly in this way. It is true that the heating power is increased in this configuration by comparison with heating only the laser component. However, there is the option of fitting a temperature sensor on the carrier substrate or of integrating it monolithically on the surface of the carrier substrate.

The optoelectronic transmission arrangement preferably has a device for detecting the temperature of the laser component. In one refinement of the invention, this is a temperature sensor whose signal is fed to a control device for controlling the temperature of the laser component. The control device is usually located outside the actual optoelectronic transmission arrangement or outside the housing that surrounds such a transmission arrangement. The temperature of the laser component is controlled by appropriately controlling the heating power of the heating device.

In a preferred refinement of the invention, a temperature sensor is dispensed with and, instead of this, a device is provided for the direct optical detection of the emitted wavelength of the laser component, the output signal of this device being fed, in turn, to a controlling device for controlling the temperature of the laser component. In the case of this configuration, the operating point of the laser component is therefore monitored by means of a direct optical detection of the wavelength. This permits a finer stabilization of the wavelength than by means of a temperature sensor.

The device for the direct optical detection of the emitted wavelength of a laser component preferably has a first and a second photodiode that are both irradiated with a fraction of the light emitted by the laser component. In this case, the first laser diode is provided with an optical sharp cutoff filter whose transmitted optical power is continuously a function of the emitted wavelength of the laser component. Such an optical sharp cutoff filter has a first region in which the light is strongly absorbed or reflected. In a second transition region, the transmission increases continuously and substantially linearly as a rule. High transmission obtains in a third region. The sharp cutoff filter arranged on the first laser diode can be configured in such a way that the operating wavelength of the laser component is within the said transmission region.

There is now detected via the first photodiode a first signal whose magnitude is a function of the emitted wavelength of the laser component. A second signal, which is proportional to the emitted optical power of the laser diode, is detected via the second photodiode, which is not covered by a sharp cutoff filter. The quotient of the two signals is formed, and a wavelength from the transition region is assigned to this quotient. This information is used to control the temperature of the laser component by controlling the heating device as appropriate. The quotient of the signal of the first and second photodiodes can here therefore be assigned a specific wavelength in each case, since the magnitude of the signal detected by the first photodiode is a function of the emitted wavelength of the laser component because of the sharp cutoff filter used. The signal detected by the second photodiode, which is proportional to the emitted optical power of the laser, is, by contrast, substantially constant or has a known temperature dependence.

In a preferred refinement, the two photodiodes are arranged next to one another, and preferably integrated in a common substrate in this case. The light from the laser component can be directed via a deflecting mirror onto the two photodiodes. Alternatively, it can be provided that the laser component and the photodiodes are positioned relative to one another in such a way that the light from the laser component falls directly onto the photodiodes.

The individual components of the optoelectronic arrangement are preferably arranged in a hermetically tight housing of small design. Such a housing is, for example, a TO package. TO packages consist of a metallic baseplate in which the electrical connections are carried out by glass encapsulation. A cap is mounted on the baseplate and hermetically connected to the baseplate.

The laser component is preferably designed as a prefabricated laser chip with two electric connector contacts. The photodiodes are likewise preferably designed as prefabricated photodiode chips, both photodiodes preferably being integrated in one chip.

BRIEF DESCRIPTION OF THE DRAWINGS

The invention is explained in more detail below with the aid of a number of exemplary embodiments and with reference to the drawings, in which.

DESCRIPTION OF SEVERAL PREFERRED EXEMPLARY EMBODIMENTS

Figure 1:
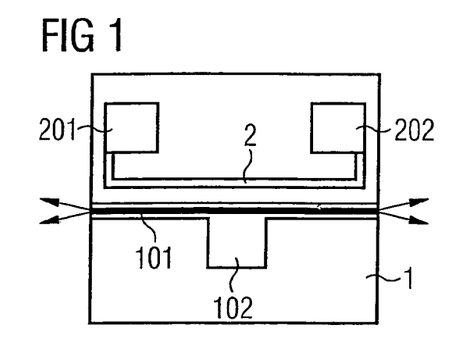
FIG. 1 shows a laser diode chip with an integrated resistance heater, in plan view.

FIG. 1 shows a plan view of a laser diode chip 1 with a laser channel 101 in which a stimulated emission of photons takes place. The laser diode is designed as an edge emitter in the exemplary embodiment illustrated, and so the laser light emerges from the laser channel 101 at the end face, as indicated by arrows. A first metallization or a first bonding pad 102 serves as an electrical connector contact. A second metallization is arranged in a corresponding way on the underside of the chip 1.

Running parallel to the laser channel 101 is a resistance heater that is formed by a resistance conductor track 2 with an ohmic resistance. Electrical contact is made with the resistance conductor track 2 via two contacts or bonding pads 201, 202, and it is heated by the flow of current. The heating power of the resistance heater can be set in this case via the applied voltage.

The resistance heater 2 is located relatively near the laser channel 101 such that a relatively low heating power is required to increase the operating temperature of the laser. It is advantageous in this case when the substrate of the laser consists of a material that is a relatively poor conductor of heat, such as InP for example.

Figure 2:
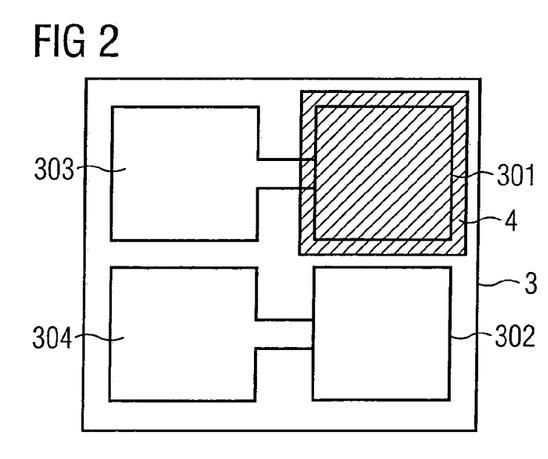
FIG. 2 shows a photodiode chip with two photodiodes arranged next to one another, one of the photodiodes being covered by a sharp cutoff filter.

FIG. 2 shows a photodiode chip 3 on which two photodiodes 301, 302 with associated contact pads 303, 304 are fitted in a neighboring fashion close to one another. The contact pads 303, 304 respectively constitute a contact for capping a measuring signal. A common electrode is located on the underside. A double diode is present.

A sharp cutoff filter is applied to the upper one of two photodiodes 301, on the diode surface. The application is performed, for example, by vapor deposition, by sputtering dielectric layers, by epitaxial methods or else by applying a film.

Figure 3:
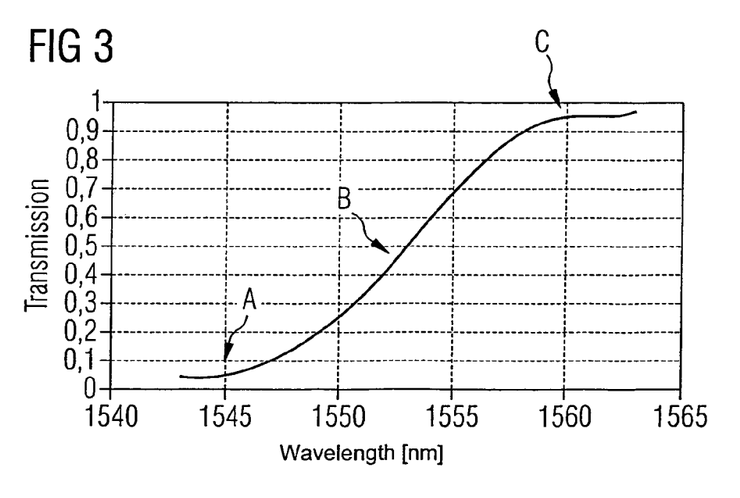
FIG. 3 shows the transmission curve of a sharp cutoff filter of a photodiode in accordance with FIG. 2.

FIG. 3 shows the transmission curve of the sharp cutoff filter 4. Accordingly, a first region A is provided in which the edge emitter strongly absorbs or reflects the light. In a third region C, by contrast, there is a very high transmission. In a transmission region B, which runs substantially linearly, lying there between the transmission is increased continuously as a function of the wavelength. In the photodiode chip of FIG. 2, the edge emitter 4 is configured in such a way that the operating wavelength of a laser light to be detected is situated within the transition region B. It follows directly from this that the quotient of the two signals of the two photodiodes 301, 302 can respectively be assigned a wavelength in the transition region B. The wavelength of a laser diode to be monitored can be directly detected in this way by means of the double diode 301, 302.

FIG. 3 shows a sharp cutoff filter in which the linear transition region B is approximately between 1545 and 1560 nm. It may be pointed out that this region is to be understood only by way of example. However, a preferred refinement consists in the use of an edge emitter 1 that emits light of a wavelength of approximately 1550 nm.

Figure 4:
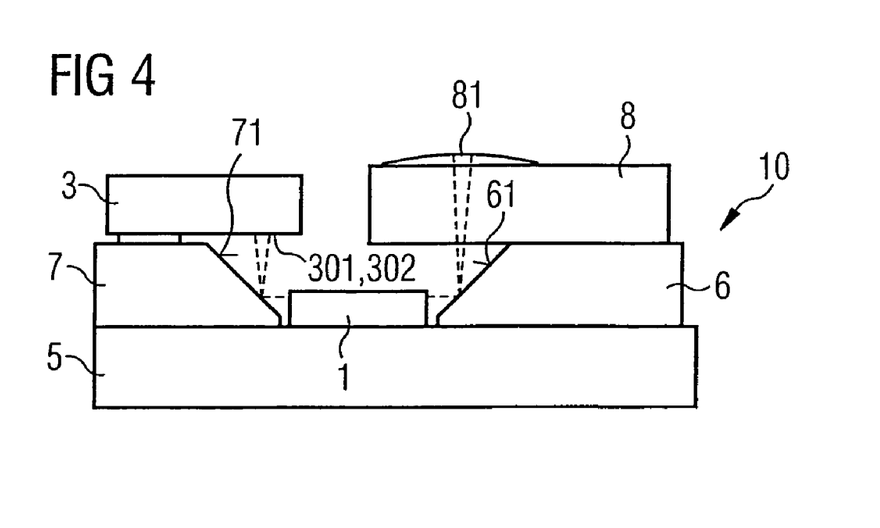
FIG. 4 shows a side view of an optoelectronic micromodule with a laser chip in accordance with FIG. 1.

FIG. 4 shows an optoelectronic micromodel 10 in which the laser diode 1 in accordance with FIG. 1 is arranged on a submount 5. Arranged to the side of the laser diode 1 are two deflecting devices 6, 7 with obliquely running mirror surfaces 61, 71. On the top side of the left-hand deflecting device 7, a photodiode chip 3 of FIG. 2 is arranged with the top side downward. Located on the top side of the right-hand deflecting device 6 is a carrier element 8 that is transparent to a wavelength of the light emitted by the laser diode 1 and has a light-focusing lens 81 which is integrated or mounted.

Figure 5:
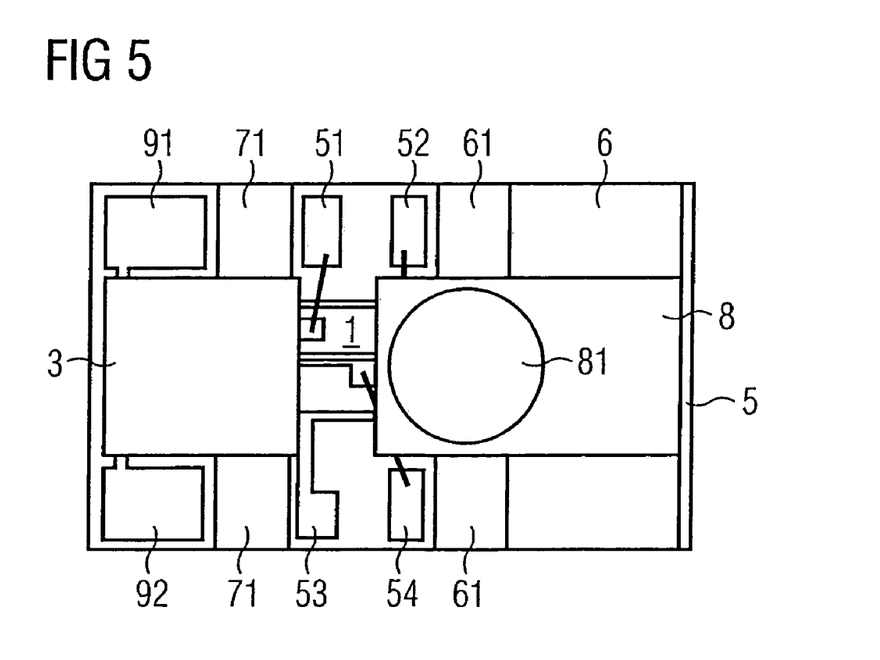
FIG. 5 shows the micromodule of FIG. 4, in plan view.

FIG. 5 shows the micromodule of FIG. 4 in plan view, the individual contact pads for the electric connection of bonding wires being illustrated. Contact pads 91, 92 on the top side of the left-hand deflecting device 7 enable contact to be made with the contact pads 303, 304 of the double diode. Contact with the contacts 201, 202 on the top side of the laser diode chip 1 can be performed via contact pads 51, 52 on the top side of the submount 5 via bonding wires, compare FIG. 1. Contact pads 53, 54 serve to make contact with the laser diode.

The mode of operation of the micromodule 10 is such that the light respectively emitted from the front and rear facets of the laser diode 1 is deflected upward by 90° by the deflecting mirrors 61, 71 of the deflecting devices 6, 7. The laser diode 1 is designed in accordance with FIG. 1 and has a resistance heater. The photodiode chip 3 with the double diode is applied (for example soldered or bonded with the aid of a conductive adhesive) around the left-hand deflecting device 7 with the top side downward in such a way that the radiation emerging from the left-hand laser facets in a widening fashion strikes the two photodiodes 301, 302. After reflection at the deflecting mirror 61, the light emerging from the right-hand laser facet penetrates the carrier element 8, and is focused by the lens 81. The focal point of the imaging of the lens 81 lies outside the TO package.

Two photodiodes 301, 302 of the photodiode chip 3 in this case serve the purpose of monitoring the optical power and of the direct optical detection of the wavelength emitted by the laser diode chip 1. Thus, one photodiode 302 serves as monitor diode whose signal is fed to a monitoring device for controlling the laser power. The other photodiode 301, covered by the sharp cutoff filter, detects a signal that, as explained, is a function of the emitted wavelength of the laser diode chip 1. The current wavelength of the laser diode 1 can be determined via the quotient of the two signals of the photodiodes 301, 302. This information is then fed for the purpose of controlling the temperature of the laser component to a controlling device which controls the heating device 2 such that the temperature of the laser diode is stable, and consequently the wavelength of the light emitted by the laser diode 1 is constant.

The laser diode 1 is operated in this case at a temperature that is equal to or somewhat above the highest operating temperature of a laser diode to be expected. This permits the temperature of the laser, and the emitted wavelength to be kept constant in a particularly effective and simple way.

Figure 6:
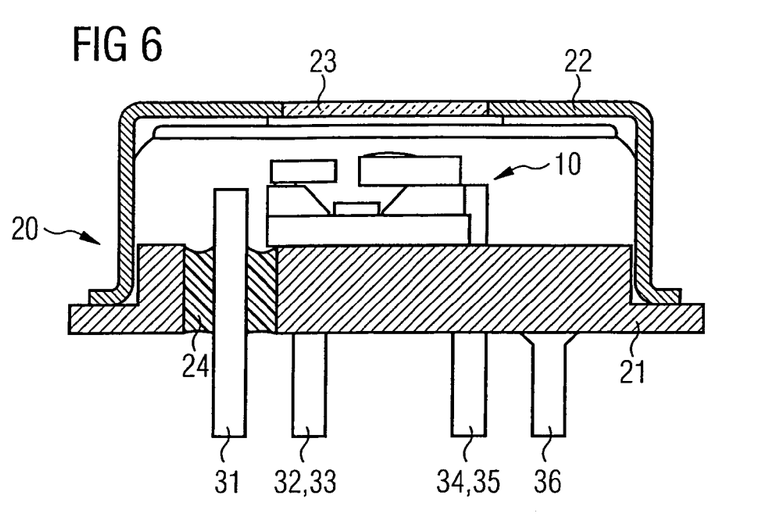
FIG. 6 shows a partially sectioned view of the micromodule of FIGS. 4 and 5, arranged in a TO package.

FIG. 6 shows the micromodule of FIGS. 4 and 5 in a TO package 20 that is known per se and has a metallic baseplate 21 on which the micromodule 10 is arranged. A metallic cap 22 with a light exit window 23 is mounted on the baseplate 21 and welded to the latter such that there is a hermetic encapsulation. Contact is made via connecting pins 31 to 36, of which the connecting pins 31 to 35 are guided through the baseplate 21 by means of insulating glass encapsulations 24. A further connecting pin 36 is electrically connected to the baseplate 21 and provides a round connection.

Figure 7:
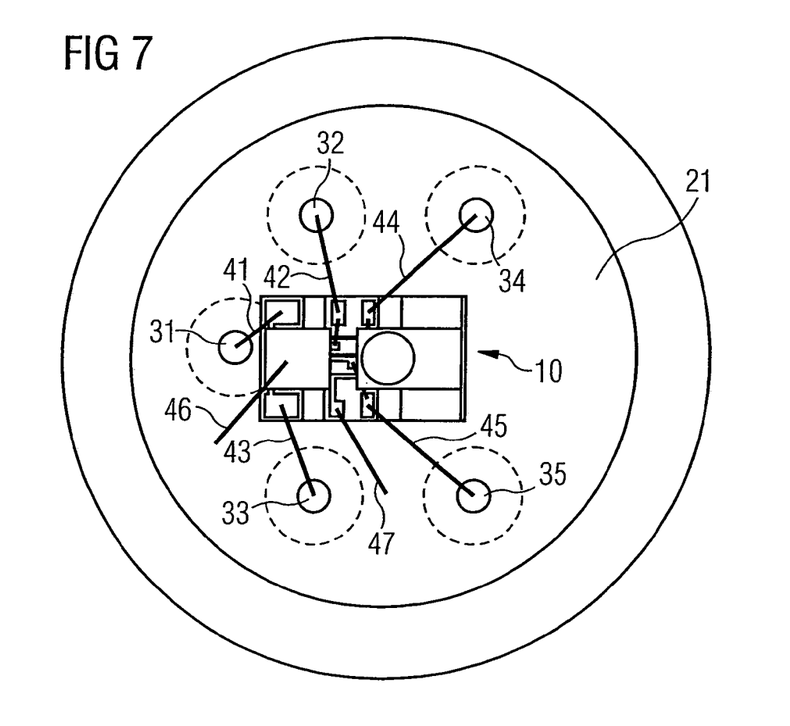
FIG. 7 shows a plan view of the arrangement in accordance with FIG. 6.

FIG. 7 shows the way electrical contact is made with the individual components of the micromodule 10 of FIGS. 4 and 5 by means of the contact pins 31 to 36. The micromodule 10 in this case has contact pads 51–54, 91, 92 in accordance with the illustration of FIG. 5, and so reference is also made in supplement to FIG. 5.

The contact pins 31, 33 ensure contact is made with the two photodiodes 301, 302 of the photodiode chip 3 via bonding wires 41, 43. The common backside contact of the photodiode chip is connected via a bonding wire 46 to the baseplate 21, and thus to ground. Contact is made with the two contact pads 201, 202 of the resistance heater 2 via the contact pins 32, 34 and bonding pads 42, 44. The contact pad 102 on the top side of the laser diode 1 is connected to the contact pin 35 via the contact pad 54 of the submount 5 and a bonding wire 45. The underside of the laser chip 1 is connected to the baseplate 21, and thereby to ground, via the contact pad 53 and a bonding wire 47.

The refinement of FIGS. 6 and 7 makes available a compact optoelectronic transmission arrangement that has a heated laser chip 1, and in this case a device for the direct optical detection of the wavelength of the laser chip is integrated without the need for a separate temperature sensor. The direct optical detection of the wavelength of the laser chip enables a very exact monitoring of the emitted wavelength. A space saving, trim and stable system is provided by fitting the components in a hermetically tight, small package.

Figure 8:
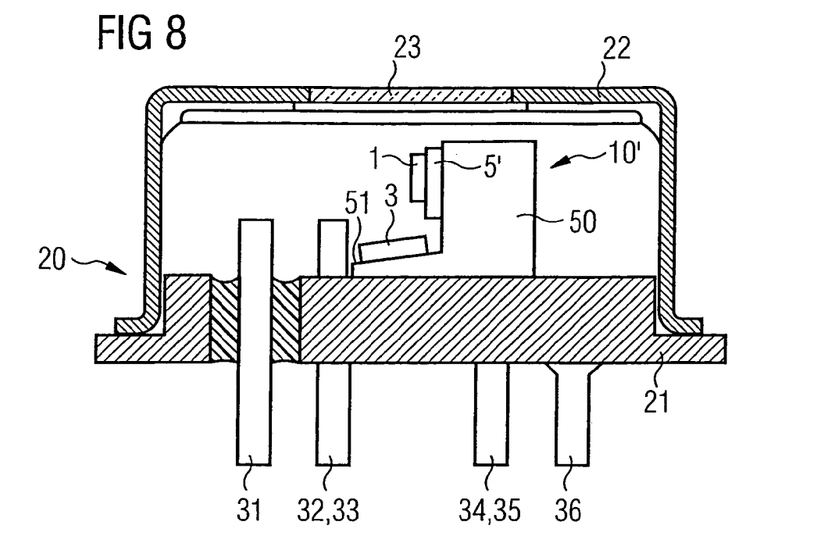
FIG. 8 shows a partially section view of an alternative refinement of a micromodule, arranged in a TO package.
Figure 9:
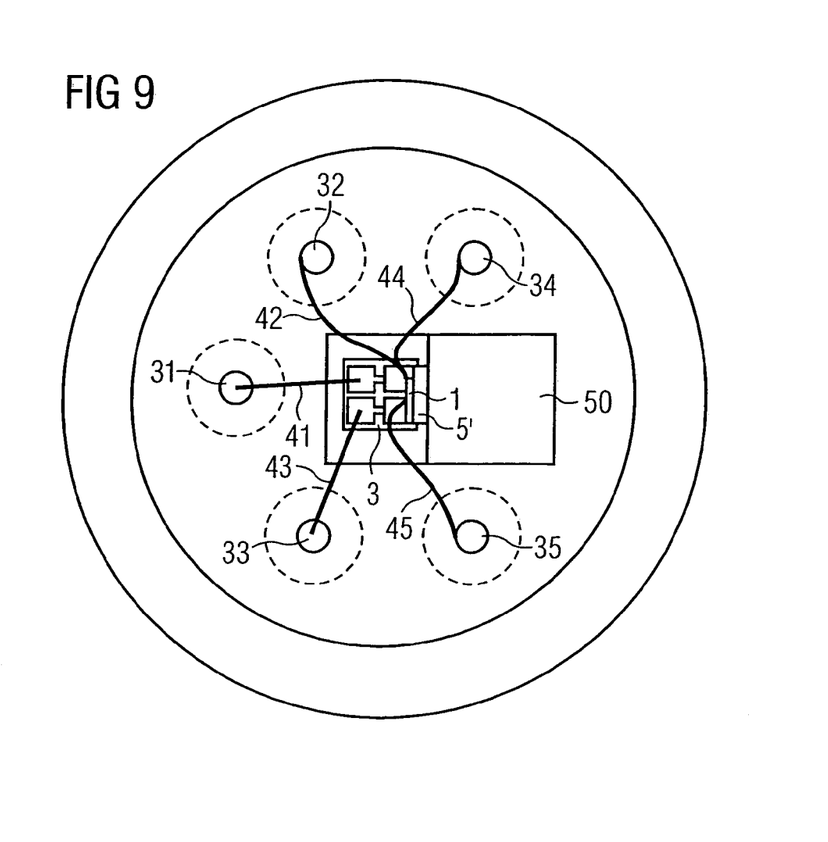
FIG. 9 shows a plan view of the arrangement of FIG. 8.

FIGS. 8 and 9 illustrate an alternative configuration of a micromodule 10' in a TO package. Once again, an edge emitting laser chip 1 corresponding to the configuration of FIG. 1 is provided. However, by contrast with the preceding exemplary embodiment said chip is fastened in a vertical alignment on a fastening block 50 via a submount 5'. A photodiode chip 3 with two photodiodes 301, 302 in accordance with FIG. 2 is located on an oblique supporting surface 51 of the fastening block 50 such that the two chips 1, 3 are arranged relative to one another at an angle of somewhat greater than 90°. An arrangement at an angle of 90° or a somewhat smaller angle would also likewise be possible. The light emitted from the lower facet of the laser diode 1 falls directly onto the two photodiodes 301, 302 of the photodiode chip 3. The light emitted from the upper facets is emitted from the window 23 of the TO package 20 without the need for a deflecting device.

In accordance with FIG. 9, contact is again made with the individual components via the individual connecting pins 31 to 36 and corresponding bonding wires 41 to 45. The two contact pins 31, 33 in this case make contact directly with the contact pads 303, 304 of the photodiode chip 3 via bonding wires 41, 43 (compare FIG. 2). The two upper contact pins 32, 34 serve to make contact with the resistance heater 2. The contact pin 35 serves to make contact with the photodiode 1. The ground contacts, which are connected to the electrically conducting baseplate 21 via bonding pads, are not illustrated in FIG. 9.

In a variant of the exemplary embodiment of FIGS. 8 and 9, the sharp cutoff filter is designed as a separate part and mounted on one of the two photodiodes. This is also possible in principle with the exemplary embodiment of FIGS. 2 to 7. However, the exemplary embodiment of FIGS. 8 and 9 enables this in a particularly simple way, since sufficient space is available above the photodiodes.

The TO package used preferably has external dimensions of at most 6 mm perpendicular to the optical axis of the emerging laser light such that assembly is possible in so-called small form factor (SFF) transceivers and small form pluggable factor (SFP) transceivers of small design. In accordance with the SFF or SFP industry standard, the transmit path and receive path must comply with a mutual spacing of 6.5 mm at the optical plug interface.

The invention is not restricted in its configuration to the exemplary embodiment illustrated above, which is to be understood merely by way of example. The person skilled in the art will recognize that numerous alternative variant designs exist which employ the teaching defined in the following claims despite their deviation from the exemplary embodiment described. For example, the heating device can be designed in a way other than that described. For example, it is possible to use as heating device a reversely operated Peltier element on which the laser component is mounted directly or via a carrier. The configuration of the package and the exact modular design, for example, are also to be understood merely as exemplary. Furthermore, it is also possible to use other designs of a laser diode than an edge emitter illustrated in the exemplary embodiments. In particular, the invention can likewise be used with vertically emitting laser diodes (VCSEL).

The invention claimed is:

1. An optoelectronic arrangement, comprising:
   at least one laser component, and
   a heating device for heating the laser component up to a constant temperature in such a way that the laser component is operated at a temperature that is greater than the highest temperature to be expected that would be present during operation of the laser component without the heating device, wherein the optoelectronic arrangement excludes a cooling device for actively cooling the laser component.

2. The optoelectronic arrangement as claimed in claim 1, wherein the heating device is integrated in the laser component.

3. The optoelectronic arrangement as claimed in claim 2, wherein the heating device comprises a resistance conductor track.

4. The optoelectronic arrangement as claimed in claim 3, wherein the resistance conductor track runs near an active laser channel of the laser component.

5. The optoelectronic arrangement as claimed in claim 1, further comprising a carrier substrate on which the laser component is mounted.

6. The optoelectronic arrangement as claimed in claim 5, wherein the heating device heats the carrier substrate.

7. The optoelectronic arrangement as claimed in claim 1, further comprising a device for detecting the temperature of the laser component.

8. The optoelectronic arrangement as claimed in claim 7, wherein the device for detecting the temperature of the laser component comprises a temperature sensor whose signal is fed to a control device for controlling the temperature of the laser component.

9. The optoelectronic arrangement as claimed in claim 7, wherein the device for detecting the temperature of the laser component is arranged on the carrier substrate.

10. The optoelectronic arrangement as claimed in claim 1, further comprising a device for the direct optical detection of the emitted wavelength of the laser component, the output signal of this device being fed to a controlling device for controlling the temperature of the laser component.

11. The optoelectronic arrangement as claimed in claim 10, wherein the device for the direct optical detection of the emitted wavelength of the laser component comprises a first and a second photodiode that are both irradiated with a fraction of the light emitted by the laser component, the first photodiode having an optical sharp cutoff filter associated therewith whose transmitted optical power is a function of the emitted wavelength of the laser component.

12. The optoelectronic arrangement as claimed in claim 11, wherein the two photodiodes are arranged next to one another.

13. The optoelectronic arrangement as claimed in claim 11, wherein light from the laser component is directed onto the photodiodes via a deflecting mirror.

14. The optoelectronic arrangement as claimed in claim 11, wherein the laser component and the photodiodes are positioned relative to one another in such a way that light from the laser component is directed directly onto the photodiodes.

15. The optoelectronic arrangement as claimed in claim 1, wherein the individual components of the arrangement are arranged in a hermetically sealed housing of small design.

16. The optoelectronic arrangement as claimed in claim 15, wherein the individual components of the arrangement are arranged in a TO package.

17. The optoelectronic arrangement as claimed in claim 1, wherein the laser component is designed as a laser chip with two electric connector contacts.

18. A method for operating a laser component, comprising:
    determining a highest temperature of the laser component to be expected during operation of the laser component without a heating thereof;
    heating the laser component up to a constant temperature that is greater than the determined highest temperature to be expected that would be present during operation of the laser component without the heating thereof, wherein the heating excludes active cooling of the laser component; and operating the laser component at the constant temperature.

19. The method as claimed in claim 18, wherein the laser component is heated directly.

20. The method as claimed in claim 18, wherein heating the laser component comprises heating a component on which the laser component is arranged.

21. The method as claimed in claim 18, further comprising detecting the temperature of the laser component and using the detected temperature for controlling the heating operation.

22. The method as claimed in claim 18, further comprising detecting a wavelength emitted by the laser component in a direct optical fashion and using the detected wavelength information to control the heating operation.

23. The method as claimed in claim 22, wherein the wavelength emitted by the laser component is detected in a direct optical fashion, and wherein such detection comprises:

detecting a first signal whose magnitude is a function of emitted wavelength of the laser component, detecting a second signal which is proportional to the emitted optical power of the laser diode, forming a quotient of the two signals, determining a currently emitted wavelength of the laser diode from the quotient, and using the determined emitted wavelength information to control the temperature of the laser component by controlling the heating operation appropriately.

* * * * *

UNITED STATES PATENT AND TRADEMARK OFFICE
CERTIFICATE OF CORRECTION

PATENT NO. : 7,167,492 B2  Page 1 of 1
APPLICATION NO. : 10/742534
DATED : January 23, 2007
INVENTOR(S) : Jörg-Reinhardt Kropp It is certified that error appears in the above-identified patent and that said Letters Patent is hereby corrected as shown below:

On Title Page Item (54) and Col. 1, Line 1-4: Please replace the Title "OPTOELECTRONIC ARRANGEMENT HAVING AT LEAST ONE LASER COMPONENT AND A METHOD FOR OPERATING A LASER COMPONENT" with the Title --OPTOELECTRONIC ARRANGEMENT CONTAINING A LASER COMPONENT AND A HEATING DEVICE--.

Signed and Sealed this

Fourth Day of September, 2007

JON W. DUDAS
*Director of the United States Patent and Trademark Office*